United States Patent
Tanaka et al.

(10) Patent No.: US 12,418,981 B2
(45) Date of Patent: Sep. 16, 2025

(54) WIRING BOARD

(71) Applicant: SHINKO ELECTRIC INDUSTRIES CO., LTD., Nagano (JP)

(72) Inventors: Hikaru Tanaka, Nagano (JP); Takashi Kasuga, Nagano (JP); Tomoyuki Shimodaira, Nagano (JP); Hitoshi Kondo, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 445 days.

(21) Appl. No.: 17/937,831

(22) Filed: Oct. 4, 2022

(65) Prior Publication Data
US 2023/0123522 A1  Apr. 20, 2023

(30) Foreign Application Priority Data
Oct. 19, 2021 (JP) ................... 2021-171148

(51) Int. Cl.
*H05K 1/11* (2006.01)

(52) U.S. Cl.
CPC .............. *H05K 1/111* (2013.01); *H05K 1/115* (2013.01); *H05K 2201/09036* (2013.01)

(58) Field of Classification Search
CPC ........ H05K 1/111; H05K 1/113; H05K 1/115; H05K 2201/09036; H05K 2201/09472; H05K 2201/096; H05K 3/4007; H05K 3/4682
See application file for complete search history.

(56) References Cited

U.S. PATENT DOCUMENTS

| | | | |
|---|---|---|---|
| 2008/0149383 A1* | 6/2008 | Kaneko | H01L 23/49827 174/262 |
| 2016/0044792 A1* | 2/2016 | Kaneko | H05K 3/4682 205/125 |
| 2017/0372997 A1 | 12/2017 | Tsukamoto | |
| 2018/0096926 A1* | 4/2018 | Imafuji | H01L 23/3185 |
| 2021/0092841 A1* | 3/2021 | Yoshida | H05K 3/4605 |
| 2022/0037249 A1* | 2/2022 | Kim | H01L 23/13 |

FOREIGN PATENT DOCUMENTS

| | | |
|---|---|---|
| JP | 2008-141070 | 6/2008 |
| JP | 2017-228719 | 12/2017 |

OTHER PUBLICATIONS

Office Action mailed on Feb. 4, 2025 with respect to the corresponding Japanese patent application No. 2021-171148.

* cited by examiner

*Primary Examiner* — Timothy J Thompson
*Assistant Examiner* — Rhadames Alonzo Miller
(74) *Attorney, Agent, or Firm* — IPUSA, PLLC

(57) ABSTRACT

A wiring board includes a pad configured to make an external electrical connection, and an insulating layer. A portion of a lower surface of the pad is covered with the insulating layer. The pad includes a base portion, and an extending portion formed integrally with the base portion and extending toward an outer periphery of a side surface of the base portion in a plan view at a lower end of the side surface of the base portion. The insulating layer is provided with a groove that is located in a periphery of the pad in the plan view, exposes a side surface of the pad, and opens to an upper surface of the insulating layer.

11 Claims, 13 Drawing Sheets

WIRING BOARD

CROSS-REFERENCE TO RELATED APPLICATIONS

This application is based upon and claims priority to Japanese Patent Application No. 2021-171148, filed on Oct. 19, 2021, the entire contents of which are incorporated herein by reference.

FIELD

Certain aspects of the embodiments discussed herein are related to wiring boards, and methods for manufacturing wiring boards.

BACKGROUND

A wiring board includes a pad exposed from an insulating layer disposed at an outermost layer, for example. The pad is used as an external connection pad for making an electrical connection with a mother board or the like, for example. A method for manufacturing this wiring board includes the steps of forming the external connection pad on an upper surface of a support body, forming an insulating layer on the support body so as to cover the external connection pad, and removing the support body.

An example of the wiring board is proposed in a Japanese Laid-Open Patent Publication No. 2008-141070, for example.

In a case where an area of a top surface of the pad is large, an electrostatic capacitance may become large and deteriorate an electrical signal. For this reason, in recent years, there are demands to reduce the area of the top surface of the pad, in order to reduce the electrostatic capacitance. On the other hand, from a viewpoint of ensuring compatibility with conventional wiring boards with regard to sockets or the like used for making connections to the wiring boards, there are demands not to change a size of an opening in the insulating layer in a periphery of the pad, even when the size of pad is reduced.

In order to satisfy these demands, an outer edge of the pad needs to be moved to the inner side of the outer edge of the opening in the insulating layer in the periphery of the pad in a plan view, without moving the outer edge of the opening in the insulating layer. However, it is difficult to move only the outer edge of the pad to the inner side of the outer edge of the opening in the insulating layer.

SUMMARY

Accordingly, it is an object in one aspect of the embodiments to provide a wiring board in which an outer edge of an external connection pad is disposed on the inner side of an outer edge of an opening in an insulating layer, and a method for manufacturing such a wiring board.

According to one aspect of the embodiments, a wiring includes a pad configured to make an external electrical connection; and an insulating layer, wherein a portion of a lower surface of the pad is covered with the insulating layer, the pad includes a base portion, and an extending portion formed integrally with the base portion and extending toward an outer periphery of a side surface of the base portion in a plan view at a lower end of the side surface of the base portion, and the insulating layer is provided with a groove that is located in a periphery of the pad in the plan view, exposes a side surface of the pad, and opens to an upper surface of the insulating layer.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
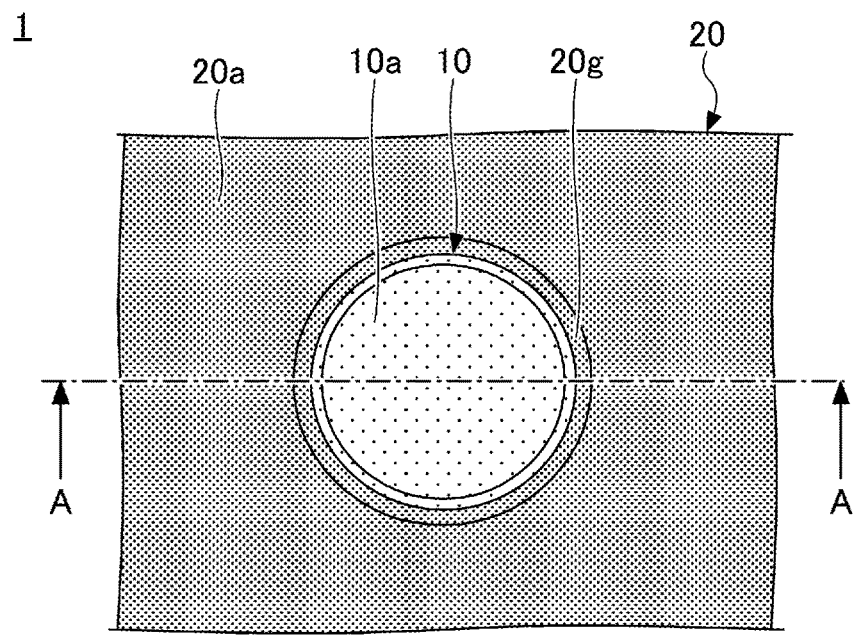
FIG. 1A and FIG. 1B are diagrams illustrating an example of a wiring board according to a first embodiment.

Preferred embodiments of the present invention will be described with reference to the accompanying drawings. In the drawings, constituent elements that are the same are designated by the same reference numerals, and a repeated description of the same constituent elements may be omitted.

A description will now be given of a wiring board and a method for manufacturing the wiring board according to embodiments and modifications of the present invention.

First Embodiment

[Structure of Wiring Board]

Figure 1B:
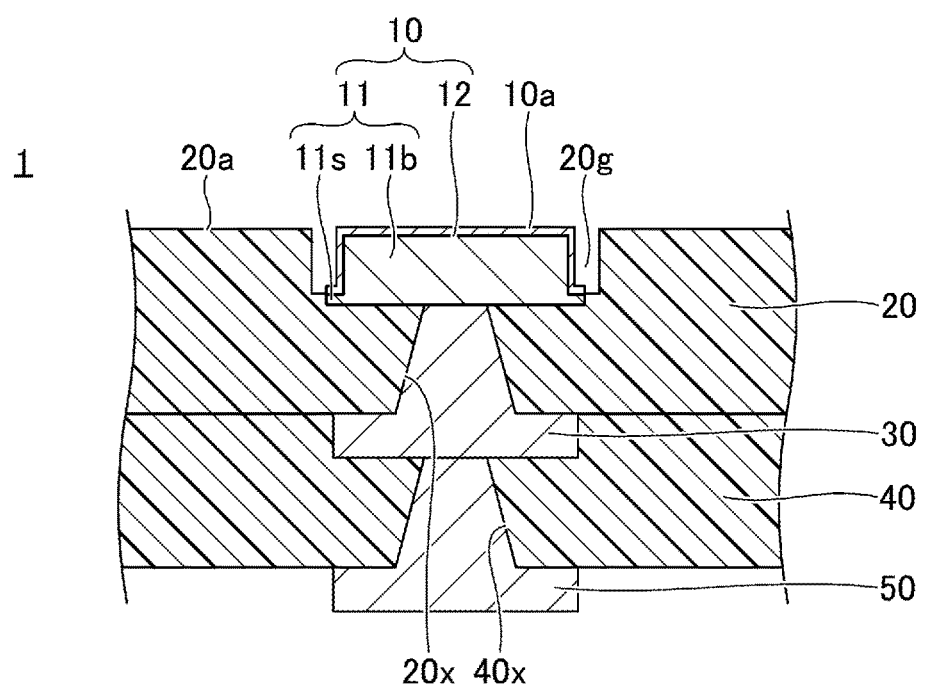

FIG. 1A and FIG. 1B are diagrams illustrating an example of the wiring board according to a first embodiment. FIG. 1A is a partial plan view of the wiring board, and FIG. 1B is a partial cross sectional view of the wiring board along a line A-A in FIG. 1A.

As illustrated in FIG. 1A and FIG. 1B, a wiring board 1 includes a pad 10, an insulating layer 20, an interconnect layer 30, an insulating layer 40, and an interconnect layer 50. The wiring board 1 may further include additional insulating layers and interconnect layers.

In the present embodiment, for the sake of convenience, the side of the wiring board 1 provided with the insulating layer 20 in FIG. 1B will be referred to as an upper side or one side, and the side of the wiring board 1 provided with the insulating layer 40 in FIG. 1B will be referred to as a lower side or the other side. In addition, the surface of a portion of the wiring board 1 disposed on the side of the insulating layer 20 will be referred to as an upper surface or one surface, and the surface of the portion of the wiring board 1 disposed on the side of the insulating layer 40 will be referred to as a lower surface or the other surface. However, the wiring board 1 may be used in an up-side-down state, or may be used in a inclined state inclined at an arbitrary angle from a horizontal state, for example. Moreover, a plan view of a target object refers to a view from above the target object in a normal direction to an upper surface 20a of the insulating layer 20, and a planar shape of the target object refers to a shape of the target object in the plan view viewed from above the target object in the normal direction to the upper surface 20a of the insulating layer 20.

The pad 10 is an external connection pad configured to make an external electrical connection. The pad 10 can be used for making the external electrical connection with a mounting board (not illustrated), such as a mother board or the like, for example. The pad 10 has a laminated structure including a metal layer 11, and a metal layer 12.

The metal layer 11 includes a base portion 11b, and an extending portion 11s. The extending portion 11s is famed integrally with the base portion 11b, and extends on an outer periphery of a side surface of the base portion 11b in the plan view, at a lower end of the side surface of the base portion 11b. The extending portion 11s is formed in an annular shape (or ring shape) on the outer periphery of the side surface of the base portion 11b in the plan view, for example.

A planar shape of the base portion 11b may be a circular shape having a diameter in a range of approximately 600 μm to approximately 800 μm, for example. However, the planar shape of the base portion 11b may be an oval shape, a rectangular shape, or other arbitrary shapes. A width of the extending portion 11s may be in a range of approximately 10 μm to approximately 30 μm, for example. A thickness of the base portion 11b may be in a range of approximately 10 μm to approximately 30 μm, for example. A thickness of the extending portion 11s may be in a range of approximately 0.5 μm to approximately 3.0 μm, for example. An area of a lower surface of the metal layer 11 may be greater than an area of an upper surface of the metal layer 11. The metal layer 11 may be a copper (Cu) layer, for example.

The metal layer 12 covers a surface of the metal layer 11 exposed from the insulating layer 20. More particularly, the metal layer 12 continuously covers an upper surface and the side surface of the base portion 11b, and an upper surface of the extending portion 11s. The metal layer 12 may be a gold (Au) layer, for example. A thickness of the metal layer 12 may be in a range of approximately 5 μm to approximately 10 μm, for example.

The metal layer 12 may have a laminated structure including a Au layer as an uppermost layer of the laminated structure. The metal layer 12 may be a Ni/Au layer, having a Ni layer on the metal layer 11, and a Au layer on the Ni layer in this laminating order, a Ni/Pd/Au layer, having a Ni layer on the metal layer 11, a Pd layer on the Ni layer, and a Au layer on the Pd layer in this laminating order, or the like.

The pad 10 is exposed at the upper surface 20a of the insulating layer 20. A portion (excluding a portion connected to a via interconnect) of a lower surface (lower surfaces of the base portion 11b and the extending portion 11s of the metal layer 11) of the pad 10 is covered with the insulating layer 20. In addition, a side surface of the extending portion 11s of the metal layer 11 is covered with the insulating layer 20. A material used for the insulating layer 20 may be an insulating resin or the like having an epoxy-based resin as a main component thereof, for example. The insulating layer 20 may include a filler, such as silica ($SiO_2$) or the like. A thickness of the insulating layer 20 may be in a range of approximately 10 μm to approximately 70 μm, for example.

An upper surface of the base portion 11b of the metal layer 11 is located at a position lower than the upper surface 20a of the insulating layer 20. A height of the upper surface 20a of the insulating layer 20, with reference to the upper surface of the base portion 11b of the metal layer 11, may be in a range of approximately 2 μm to approximately 3 μm, for example. An upper surface 10a of the pad 10 (upper surface of the metal layer 12) is located at a position higher than the upper surface 20a of the insulating layer 20. A height of the upper surface 10a of the pad 10 (upper surface of the metal layer 12), with reference to the upper surface 20a of the insulating layer 20, may be in a range of approximately 2 μm to approximately 8 μm, for example.

The insulating layer 20 is disposed in a periphery of the pad 10 in the plan view, and exposes a side surface of the pad 10. A groove 20g, opening at the upper surface 20a, is provided in the insulating layer 20. In a case where the planar shape of the pad 10 is the circular shape, the groove 20g is formed to a ring shape in the plan view, for example, so that an inner edge and an outer edge of the groove 20g form circular shapes having different diameters. A width of the groove 20g may be in a range of approximately 80 μm to approximately 100 μm, for example.

The metal layer 12 covering the side surface of the base portion 11b of the metal layer 11, and the metal layer 12 covering the upper surface of the extending portion 11s of the metal layer 11, are exposed from the insulating layer 20 inside the groove 20g. Among surfaces formed by the insulating layer 20 and exposed inside the groove 20g, when the surface at a lowest position is defined as a bottom surface of the groove 20g, the upper surface of the extending portion 11s is located at a position lower than the bottom surface of the groove 20g. A height of the bottom surface of the groove 20g, with reference to the upper surface of the extending portion 11s, may be in a range of approximately 2 μm to approximately 3 μm, for example. In addition, in the metal layer 12, when an upper surface of the portion laminated on the extending portion 11s is defined as an outer peripheral surface of the metal layer 12, the outer peripheral surface of the metal layer 12 is located at a position higher than the bottom surface of the groove 20g. A height of the outer peripheral surface of the metal layer 12, with reference to the bottom surface of the groove 20g, may be in a range of approximately 2 μm to approximately 8 μm, for example.

The interconnect layer 30 is formed on the other side of the insulating layer 20. The interconnect layer 30 includes a via interconnect filling a via hole 20x that penetrates the insulating layer 20 and exposes the lower surface of the pad 10, a via receiving pad and an interconnect pattern formed on a lower surface of the insulating layer 20, for example. The via interconnect penetrates the insulating layer 20, and makes contact with the lower surface of the pad 10. The via hole 20x may be a cavity having a truncated cone shape, and a diameter of an opening of the cavity at one end which opens to the insulating layer 40 is greater than a diameter of a bottom surface of the cavity famed by the lower surface of the pad 10. A material used for the interconnect layer 30 may be copper or the like, for example. A thickness of the via receiving pad and the interconnect pattern forming the interconnect layer 30 may be in a range of approximately 10 μm to approximately 30 μm, for example.

The insulating layer 40 is formed on the lower surface of the insulating layer 20, so as to cover the interconnect layer 30. A material used for the insulating layer 40 and a thickness of the insulating layer 40 may be the same as those of the insulating layer 20, for example. The insulating layer 40 may include a filler, such as silica ($SiO_2$) or the like.

The interconnect layer 50 is formed on the other side of the insulating layer 40. The interconnect layer 50 includes a via interconnects filling a via hole 40x that penetrates the insulating layer 40 and exposes a lower surface of the via receiving pad of the interconnect layer 30, a pad and an interconnect pattern formed on a lower surface of the insulating layer 40, for example. The via hole 40x may be a cavity having a truncated cone shape, and a diameter of an opening of the cavity at one end which opens to the lower surface the insulating layer 40 is greater than a diameter of a bottom surface of the cavity formed by the lower surface of the via receiving pad. A material used for the interconnect layer 50, and a thickness of the via receiving pad and the interconnect pattern forming the interconnect layer 50, may be the same as those of the interconnect layer 30, for example.

As described above, in the wiring board 1, the insulating layer 20 is provided with the groove 20g, that is located in the periphery of the pad 10 in the plan view, and opens to the upper surface 20a of the insulating layer 20. For this reason, an outer edge of the pad 10 can be located on the inner side of an outer edge of the opening (an outer edge of the groove 20g) of the insulating layer 20 in the plan view, thereby enabling an area of the upper surface 10a of the pad 10 to be reduced. By reducing the area of the upper surface 10a of the pad 10, it becomes possible to reduce an electrostatic capacitance of the pad 10, and to reduce a deterioration of an electrical signal passing through the pad 10.

If the groove 20g were not provided, a position of the opening in the insulating layer 20, exposing the upper surface 10a of the pad 10, would be the position where an edge defining the opening coincides with the outer edge of the pad 10 in the plan view. In this case, if the area of the upper surface 10a of the pad 10 were made smaller than that of the conventional case, the size of the opening would also become smaller, thereby making it impossible to ensure compatibility with the conventional wiring boards.

That is, although a socket is used when the pad 10 is connected to the mounting board, such as the mother board or the like, the opening in the insulating layer 20 that exposes the upper surface 10a of the pad 10 has a size such that the socket does not make contact with the insulating layer 20. Accordingly, in order to reduce the electrostatic capacitance of the pad 10 while ensuring the compatibility with the conventional wiring boards, it is necessary to reduce the area of the upper surface 10a of the pad 10 without changing the size of the opening in the insulating layer 20. By providing the groove 20g, that is located in the periphery of the pad 10 in the plan view, and opens to the upper surface 20a of the insulating layer 20, it is possible to reduce the area of the upper surface 10a of the pad 10 while ensuring compatibility with the conventional circuit boards.

Further, when the pad 10 and the mounting board, such as the mother board or the like, are connected via a solder, excess solder flows from the upper surface 10a of the pad 10 into the groove 20g. Hence, it is possible to reduce short-circuiting of mutually adjacent pads. In addition, because the solder flows into the groove 20g, the upper surface 10a and the side surface of the pad 10 are bonded three-dimensionally with the solder, thereby improving a bonding strength between the pad 10 and the solder.

Moreover, because a stepped portion is formed at a boundary between the bottom surface of the groove 20g and the outer peripheral surface of the metal layer 12, corner portions contacted by the solder flowing into the groove 20g increases. Accordingly, because a force applied to the solder is dispersed, it is possible to improve a durability of the solder.

[Method for Manufacturing Wiring Board]

Next, a method for manufacturing the wiring board according to the first embodiment will be described. FIG. 2A through FIG. 5C are diagrams illustrating an example of processes of manufacturing the wiring board according to the first embodiment. In the present embodiment, the processes of manufacturing one wiring board is described. However, a plurality of parts respectively corresponding to the wiring boards may be formed simultaneously, and the plurality of parts may thereafter be singulated into individual wiring boards.

Figure 2A:
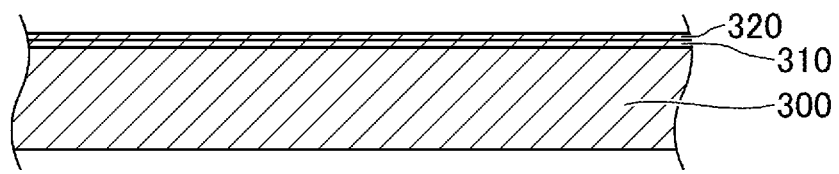
FIG. 2A, FIG. 2B, and FIG. 2C are diagrams (part 1) illustrating an example of processes of manufacturing the wiring board according to the first embodiment.

First, in the process illustrated in FIG. 2A, a support body 300 having a flat upper surface is prepared. Although a metal plate, a metal foil, or the like can be used for the support body 300, an example in which a copper foil is used as the support body 300 will be described in the present embodiment. A thickness of the support body 300 may be in a range of approximately 18 μm to approximately 100 μm, for example.

Next, sacrificial layers 310 and 320 are formed on the support body 300. The sacrificial layer 310 is formed so as to cover an entire upper surface of the support body 300, for example. The sacrificial layer 320 is famed so as to cover an entire upper surface of the sacrificial layer 310, for example. The sacrificial layer 320 is formed of a material that can be selectively etched with respect to the metal layer 11 in a subsequent process. As an example, the sacrificial layer 310 is a copper layer, and the sacrificial layer 320 is a nickel layer. A thickness of the sacrificial layer 310 may be in a range of approximately 1 μm to approximately 5 μm, for example. A thickness of the sacrificial layer 320 may be in a range of approximately 1 μm to approximately 5 μm, for example. It is not essential to provide the sacrificial layer 310, which is the copper layer, on the support body 300. However, by providing the sacrificial layer 310, which is the copper layer, on the support body 300, it is possible to obtain an effect of canceling unevenness of (or irregularities on) the upper surface of the support body 300, and to obtain an effect of improving adhesion to the support body 300.

Figure 2B:
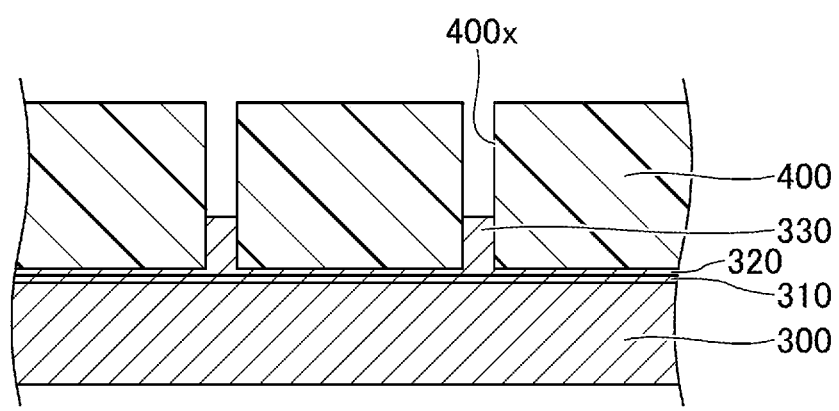
Figure 2C:
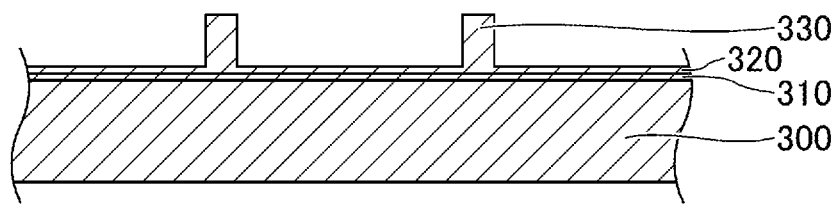

Next, in the process illustrated in FIG. 2B, an annular (ring shaped) sacrificial layer 330, protruding from an upper surface of the sacrificial layer 320, is formed on the support body 300. More particularly, a resist layer 400 (for example, a dry film resist or the like) having an opening 400x at a portion where the sacrificial layer 330 is to be formed, is first formed at a predetermined position on the upper surface of the sacrificial layer 320. The opening 400x is formed to a ring shape so that an inner edge and an outer edge of the opening 400x form circular shapes having different diameters in the plan view, for example. Then, the sacrificial layer 330 is formed on the upper surface of the sacrificial layer 320 exposed inside the opening 400x in the resist layer 400, by an electrolytic plating or the like utilizing the support body 300, the sacrificial layer 310, and the sacrificial layer 320 as a plating power supply layer. The sacrificial layer 330 is formed of a material that can be selectively etched with respect to the metal layer 11 in a subsequent process. As an example, the sacrificial layer 330 is a nickel layer. A width of the sacrificial layer 330 may be in a range of approximately 5 µm to approximately 30 µm, for example. A thickness of the sacrificial layer 330 may be in a range of approximately 5 µm to approximately 20 µm, for example. After forming the sacrificial layer 330, in the process illustrated in FIG. 2C, the resist layer 400 is removed. The sacrificial layer 320 is a typical example of a first sacrificial layer according to the present invention. In addition, the sacrificial layer 330 is a typical example of a second sacrificial layer according to the present invention.

Figure 3A:
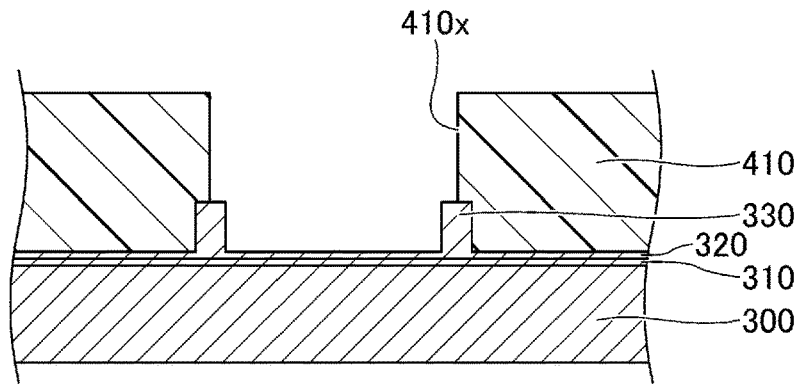
FIG. 3A, FIG. 3B, and FIG. 3C are diagrams (part 2) illustrating the example of the processes of manufacturing the wiring board according to the first embodiment.
Figure 3B:
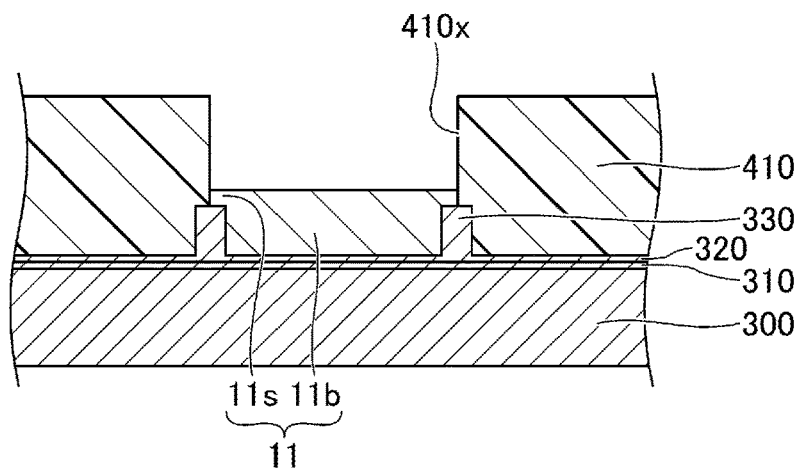

Next, in the processes illustrated in FIG. 3A and FIG. 3B, the metal layer 11 is formed so as to fill a recess formed by the sacrificial layer 320 and the sacrificial layer 330, cover the upper surface and an inner periphery of the sacrificial layer 330, and expose an outer periphery of the sacrificial layer 330. More particularly, first, in the process illustrated in FIG. 3A, a resist layer 410 (for example, a dry film resist or the like) is formed at a predetermined position on the upper surface of the sacrificial layer 320, covering the outer periphery of the upper surface of the sacrificial layer 330 having the ring shape in the plan view, and including an opening 410x exposing the inner periphery of the sacrificial layer 330. The opening 410x is formed to a circular shape in the plan view, for example. In the plan view inside the opening 410x, the inner periphery of the upper surface of the sacrificial layer 330, and the upper surface of the sacrificial layer 320 surrounded by the sacrificial layer 330, are exposed.

Next, in the process illustrated in FIG. 3B, the metal layer 11 is formed on the upper surface of the sacrificial layer 320 and the upper surface and the inner periphery of the sacrificial layer 330 that are exposed inside the opening 410x in the resist layer 410, by an electrolytic plating or the like utilizing the support body 300, the sacrificial layer 310, and the sacrificial layer 320, and the sacrificial layer 330 as a plating power supply layer. The metal layer 11 includes the base portion 11b and the extending portion 11s. A portion of the metal layer 11 formed on the upper surface of the sacrificial layer 330 exposed inside the opening 410x forms the extending portion 11s, and other portions of the metal layer 11 form the base portion 11b. The metal layer 11 is formed of a material different from that of the sacrificial layers 320 and 330, so that the sacrificial layers 320 and 330 can be selectively etched in a subsequent process. In this example, because the sacrificial layers 310 and 320 are nickel layers, the metal layer 11 is a copper layer.

Figure 3C:
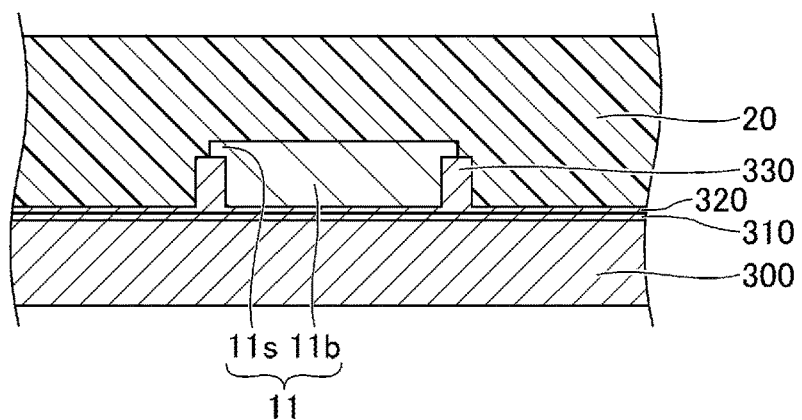

Next, in the process illustrated in FIG. 3C, the insulating layer 20 that covers the sacrificial layer 320, the sacrificial layer 330, and the metal layer 11, is formed on the support body 300. More particularly, first, after removing the resist layer 410, a film of an epoxy-based resin or the like in a semi-cured state is laminated on the support body 300, and cured to form the insulating layer 20. The insulating layer 20 is formed so as to cover the upper surface of the sacrificial layer 320 exposed from the metal layer 11, the upper surface and the outer peripheral side surface of the sacrificial layer 330 exposed from the metal layer 11, and the upper surface and the side surface of the metal layer 11 exposed from the sacrificial layer 330. Alternatively, instead of laminating the film of the epoxy-based resin or the like in the semi-cured state, a liquid or paste of the epoxy-based resin or the like may be coated and thereafter cured, so as to form the insulating layer 20. The thickness or the like of the insulating layer 20 are as described above.

Figure 4A:
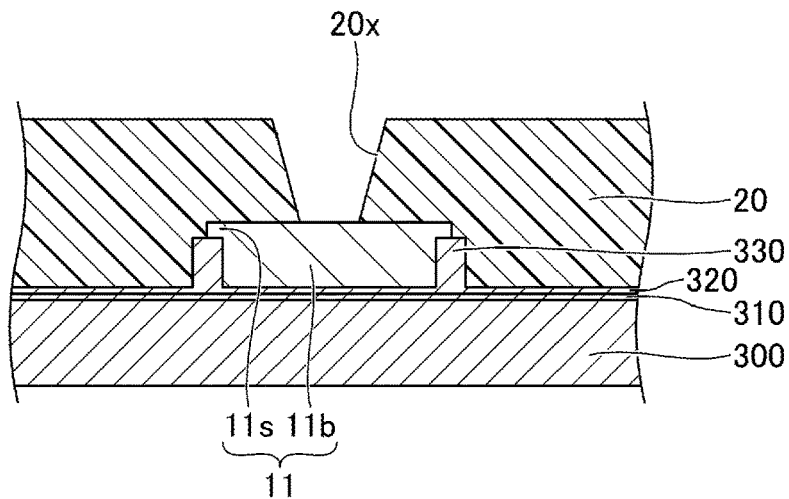
FIG. 4A, FIG. 4B, and FIG. 4C are diagrams (part 3) illustrating the example of the processes of manufacturing the wiring board according to the first embodiment.

Next, in the process illustrated in FIG. 4A, the via hole 20x is famed in the insulating layer 20, so as to penetrate the insulating layer 20 and expose the upper surface of the metal layer 11. The via hole 20x can be formed by laser beam machining using a $CO_2$ laser or the like, for example. Thereafter, a desmear process may be performed to remove residual resin adhered to the upper surface of the metal layer 11 exposed at the bottom of the via hole 20x.

Figure 4B:
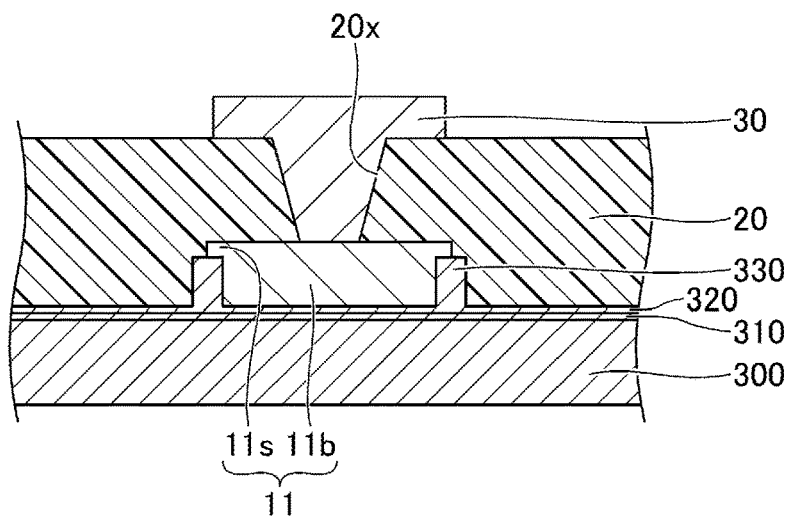

Next, in the process illustrated in FIG. 4B, the interconnect layer 30 is formed on the insulating layer 20. The interconnect layer 30 includes the via interconnect filling the via hole 20x, the via receiving pad formed on the insulating layer 20, and the interconnect pattern, for example. The interconnect layer 30 is electrically connected to the metal layer 11 exposed at the bottom of the via hole 20x. A material used for the interconnect layer 30 may be copper (Cu) or the like, for example. The interconnect layer 30 can be formed using various interconnect layer forming methods, such as a semi-additive method, a subtractive method, or the like.

Figure 4C:
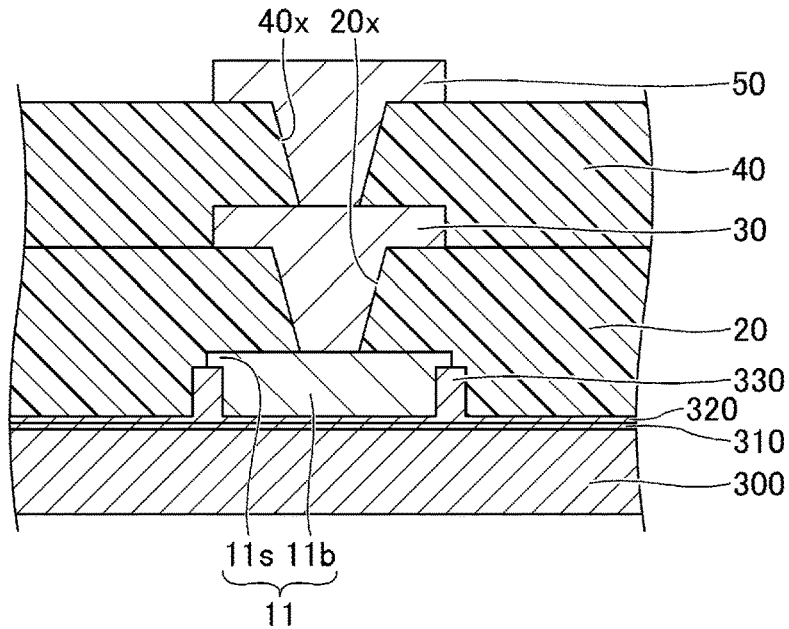

Next, in the process illustrated in FIG. 4C, the same processes as those described above in conjunction with FIG. 3C through FIG. 4B are repeated to form the insulating layer 40 on the interconnect layer 30, form the via hole 40x exposing the upper surface of the via receiving pad of the interconnect layer 30 in the insulating layer 40, and further form the interconnect layer 50. The material and thickness of the insulating layer 40 may be the same as those of the insulating layer 20, for example. The material and thickness of the interconnect layer 50 may be the same as those of the interconnect layer 30, for example.

Figure 5A:
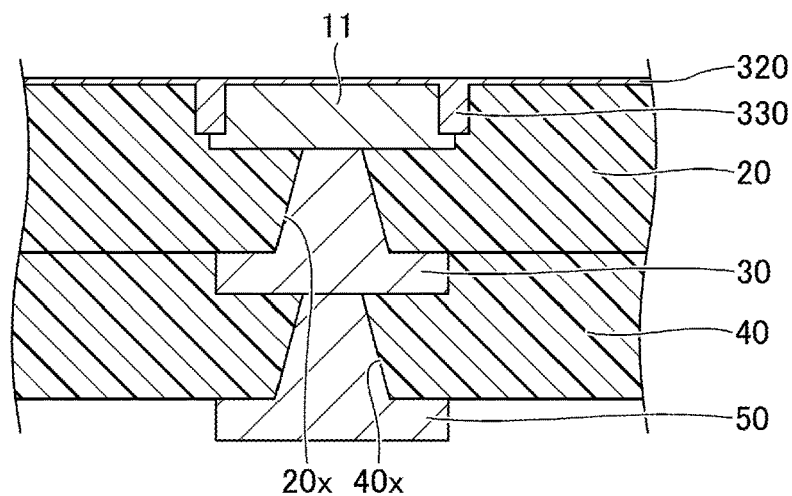
FIG. 5A, FIG. 5B, and FIG. 5C are diagrams (part 4) illustrating the example of the processes of manufacturing the wiring board according to the first embodiment.
Figure 5B:
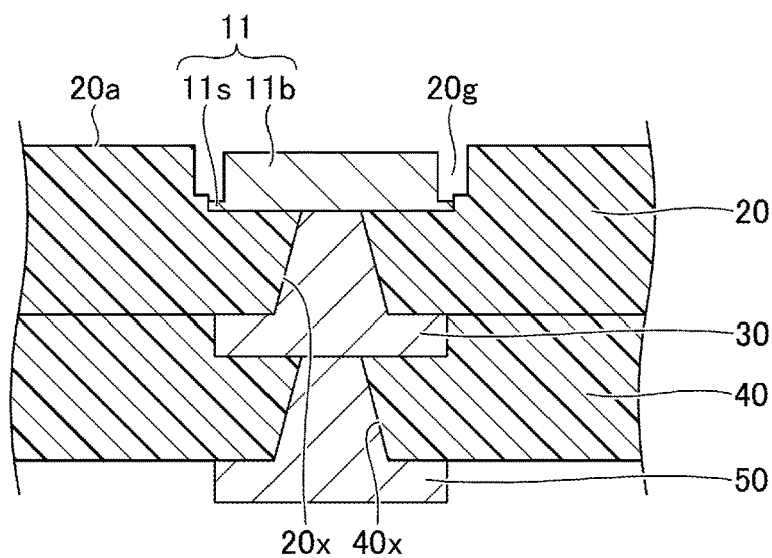
Figure 5C:
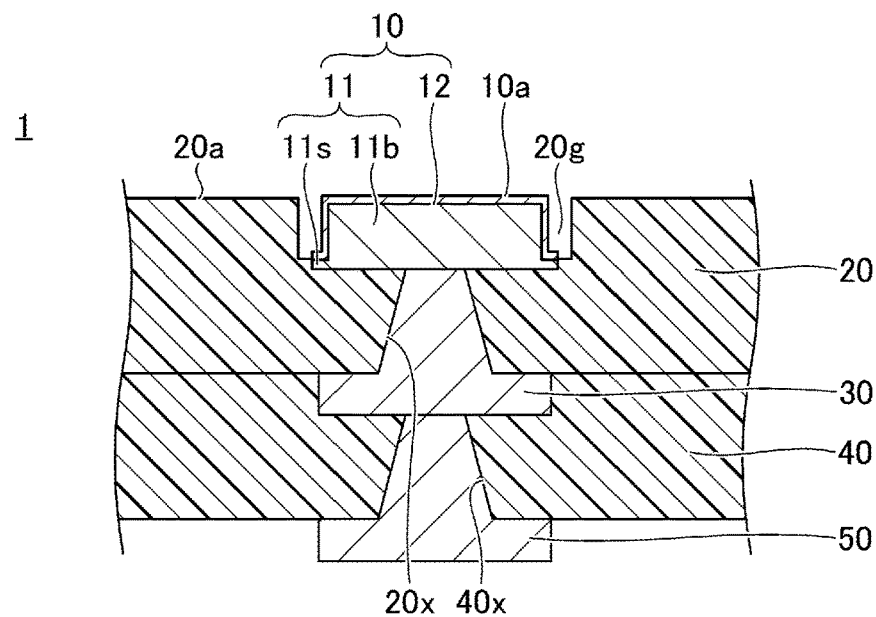

Next, in the processes illustrated in FIG. 5A through FIG. 5C, the support body 300, the sacrificial layer 310, the sacrificial layer 320, and the sacrificial layer 330 are removed by etching, and the external connection pad 10 including the metal layer 11 is formed. More particularly, first, in the process illustrated in FIG. 5A, the support body 300 and the sacrificial layer 310 illustrated in FIG. 4C are removed. The support body 300, which is a copper foil, and the sacrificial layer 310, which is a copper layer, can be removed by wet etching using a hydrogen peroxide/sulfuric acid-based aqueous solution, a sodium persulfate aqueous solution, an ammonium persulfate aqueous solution, or the like, for example. The sacrificial layer 320, which is a nickel layer, serves as an etching stopper layer, so that only the support body 300 and the sacrificial layer 310 are removed by the wet etching. FIG. 5A illustrates the structure in an up-side-down state with respect to the structure illustrated in FIG. 4C or the like. The same applies to FIG. 5B and FIG. 5C that will be described later.

Next, in the process illustrated in FIG. 5B, the sacrificial layers 320 and 330 illustrated in FIG. 5A are removed. The sacrificial layers 320 and 330, that are nickel layers, can be removed by wet etching using a hydrogen peroxide/nitric acid-based aqueous solution or the like, for example. Because copper is not removed by the etchant for removing the nickel layer, the metal layer 11 will not be etched by this etchant. As a result, the groove 20g is formed in the insulating layer 20, at the position in the periphery of the metal layer 11 in the plan view, and opening to the upper surface 20a of the insulating layer 20. For example, the groove 20g is formed in the ring shape in the plan view, so that the inner edge and the outer edge of the groove 20g form the circular shapes having the different diameters. In addition, in the metal layer 11, the side surface of the base portion 11b, and the upper surface of the extending portion 11s, are exposed inside the groove 20g. In this state, the upper surface of the base portion 11b approximately coincides with the upper surface 20a of the insulating layer 20. The upper surface of the extending portion 11s approximately coincides with the bottom surface of the groove 20g of the insulating layer 20.

Next, if necessary in order to remove the oxide film famed on the upper surface and the side surface of the base portion 11b and the upper surface of the extending portion 11s, the upper surface and the side surface of the base portion 11b and the upper surface of the extending portion 11s are etched by an amount in a range of approximately 2 µm to approximately 3 µm, for example. Thus, as illustrated in FIG. 5B, the upper surface of the base portion 11b becomes exposed at a position recessed by an amount in a range of approximately 2 µm to approximately 3 µm from the upper surface 20a of the insulating layer 20. Further, the upper surface of the extending portion 11s becomes exposed at a position recessed by an amount in a range of approximately 2 µm to approximately 3 µm from the bottom surface of the groove 20g of the insulating layer 20.

Next, in the process illustrated in FIG. 5C, the metal layer 12 is formed on the surface of the metal layer 11 exposed from the insulating layer 20, by electroless plating, for example. As a result, the wiring board 1 is completed. The metal layer 12 may be an Au layer, a Ni/Au layer (a metal layer in which a Ni layer and a Au layer are laminated in this order on the pad 10), a Ni/Pd/Au layer (a metal layer in which a Ni layer, a Pd layer, and a Au layer are laminated in this order on the pad 10), or the like, for example.

In this process, the metal layer 12 covering the side surface of the base portion 11b of the metal layer 11, and the metal layer 12 covering the upper surface of the extending portion 11s of the metal layer 11, are exposed from the insulating layer 20 inside the groove 20g. In addition, the upper surface of the metal layer 12 is located at a position higher than the upper surface 20a of the insulating layer 20 by an amount in a range of approximately 2 µm to approximately 8 µm, for example. Moreover, the outer peripheral surface of the metal layer 12 is located at a position higher than the bottom surface of the groove 20g by an amount in a range of approximately 2 µm to approximately 8 µm, for example.

<First Modification of First Embodiment>

A first modification of the first embodiment relates to an example of the wiring board having a pad with a different layer structure. In the first modification of the first embodiment, a description of the constituent elements that are the same as those of the embodiment described above may be omitted.

Figure 6A:
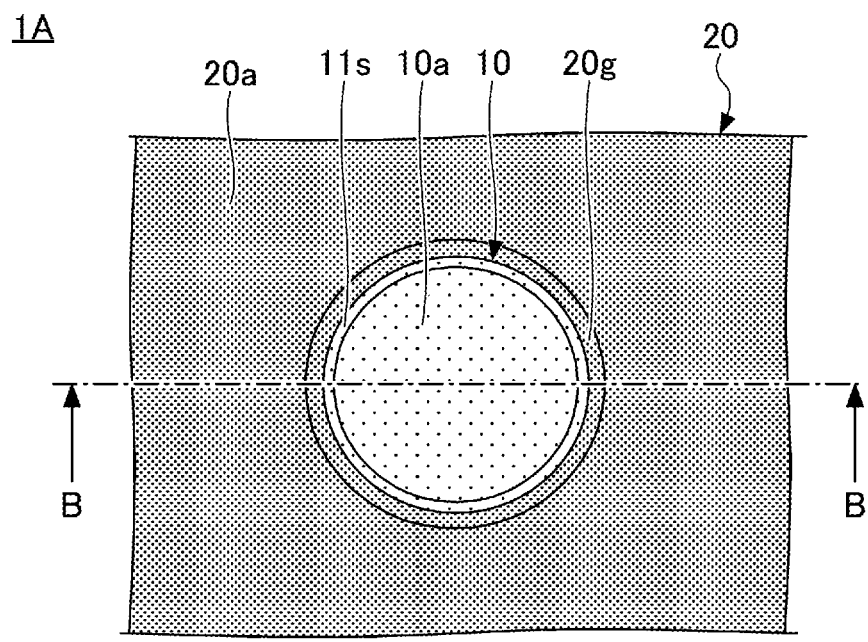
FIG. 6A and FIG. 6B are diagrams illustrating an example of the wiring board according to a first modification of the first embodiment.
Figure 6B:
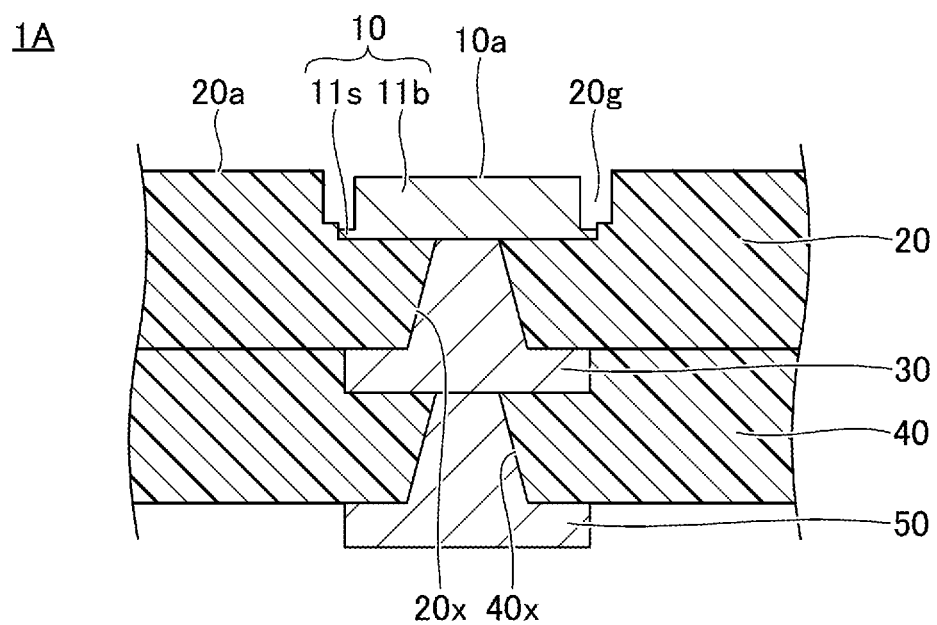

FIG. 6A and FIG. 6B are diagrams illustrating an example of the wiring board according to a first modification of the first embodiment. FIG. 6A is a partial plan view of the wiring board, and FIG. 6B is a partial cross sectional view of the wiring board along a line B-B in FIG. 6A.

As illustrated in FIG. 6A and FIG. 6B, a wiring board 1A differs from the wiring board 1 illustrated in FIG. 1A, FIG. 1B, or the like in that the pad 10 has a single-layer structure. The pad 10 is a copper layer, for example. The pad 10 includes the base portion 11b and the extending portion 11s, but does not include the metal layer 12.

The upper surface 10a of the pad 10 (the upper surface of the base portion 11b) is located at a position lower than the upper surface 20a of the insulating layer 20. The height of the upper surface 20a of the insulating layer 20, with reference to the upper surface of the base portion 11b of the pad 10, may be in a range of approximately 2 µm to approximately 3 µm, for example. The upper surface of the extending portion 11s is located at a position lower than the bottom surface of the groove 20g. The height of the bottom surface of the groove 20g, with reference to the upper surface of the extending portion 11s, may be in a range of approximately 2 µm to approximately 3 µm, for example.

An organic film, that covers the upper surface and the side surface of the base portion 11b of the pad 10, and the upper surface of the extending portion 11s of the pad 10, may be provided, as required. The organic film includes an azole compound, an imidazole compound, or the like, for example. A thickness of the organic film may be approximately 1 µm or less, for example. Although the illustration of the organic film is omitted in FIG. 6B to simplify the drawing, a coverage provided by the organic film will be the same as the coverage provided by the metal layer 12 in FIG. 5C, for example.

The wiring board 1A illustrated in FIG. 6A and FIG. 6B can be manufactured by processes that are the same as those of the first embodiment described above in conjunction with FIG. 2A through FIG. 5B. After the process illustrated in FIG. 5B, the organic film can be formed by performing an Organic Solderability Preservative (OSP) process with respect to the base portion 11b and the extending portion 11s, as required.

In a case where the pad 10 has the single-layer structure and the organic film is not formed, the etching process for removing the oxide film is not required.

Second Embodiment

A second embodiment relates to an example of the wiring board having the insulating layer including the groove with a different shape. In the second embodiment, a description of the constituent elements that are the same as those of the embodiment described above may be omitted.

Figure 7A:
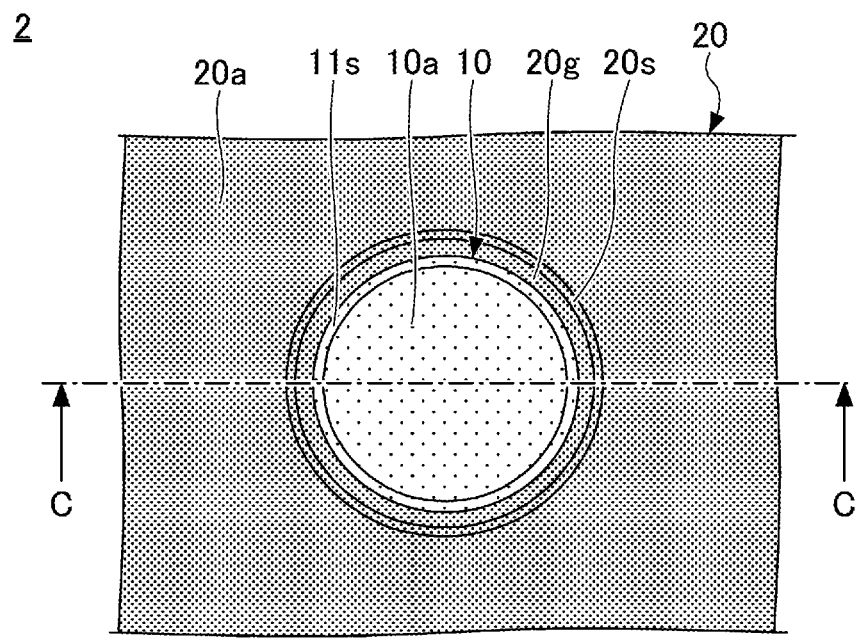
FIG. 7A and FIG. 7B are diagrams illustrating an example of the wiring board according to a second embodiment.
Figure 7B:
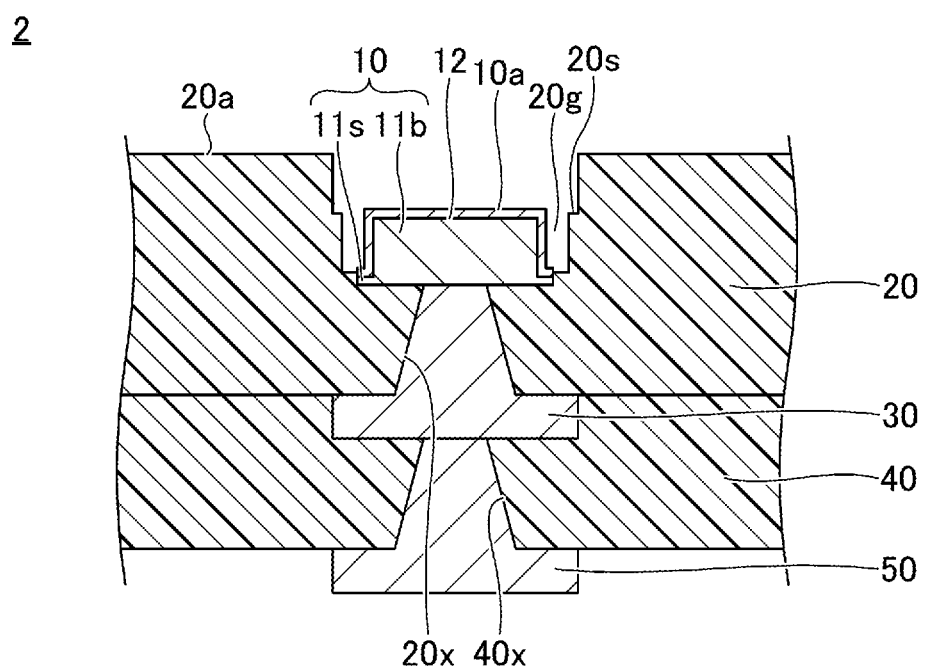

FIG. 7A and FIG. 7B are diagrams illustrating the wiring board according to the second embodiment. FIG. 7A is a partial plan view of the wiring board, and FIG. 7B is a partial cross sectional view of the wiring board along a line C-C in FIG. 7A.

As illustrated in FIG. 7A and FIG. 7B, a wiring board 2 differs from the wiring board 1 illustrated in FIG. 1A, FIG. 1B, or the like in that a stepped surface 20s is formed on the side surface of the groove 20g of the insulating layer 20, and that the upper surface 10a of the pad 10 is located at a position recessed with respect to the upper surface 20a of the insulating layer 20. The height of the upper surface 20a of the insulating layer 20, with reference to the upper surface 10a of the pad 10, may be in a range of approximately 5 µm to approximately 20 µm, for example.

In the insulating layer 20, the stepped surface 20s is located between the upper surface 20a of the insulating layer 20 and the bottom surface of the groove 20g, along a thickness direction of the wiring board 2. The stepped surface 20s is approximately parallel to the upper surface 20a of the insulating layer 20 and the bottom surface of the groove 20g. The upper surface of the base portion 11b is located at a position lower than the stepped surface 20s. A height of the stepped surface 20s, with reference to the upper surface of the base portion 11b, may be in a range of approximately 2 µm to approximately 3 µm, for example. In addition, the upper surface 10a of the pad 10 (the upper surface of the metal layer 12) is located at a position higher than the stepped surface 20s. A height of the upper surface 10a of the pad 10 (the upper surface of the metal layer 12), with reference to the stepped surface 20s, may be in a range of approximately 2 µm to approximately 8 µm, for example.

In the case where the planar shape of the pad 10 is the circular shape, the groove 20g can be formed to the ring shape in the plan view, for example, so that the inner edge and the outer edge of the groove 20g form the circular shapes having the different diameters. In the groove 20g, a width of a portion on the lower side of the stepped surface 20s may be in a range of approximately 80 µm to approximately 100 µm, for example. Moreover, a width of the stepped surface 20s may be in a range of approximately 10 µm to approximately 30 µm, for example.

The wiring board 2 illustrated in FIG. 7A and FIG. 7B can be formed in the following manner, for example. First, in the processes illustrated in FIG. 8A through FIG. 9B, sacrificial layers 340 and 350 are successively formed in a predetermined region on the support body 300, and further, an annular sacrificial layer 360 protruding from an upper surface of the sacrificial layer 350 is formed. The sacrificial layer 350 is a typical example of the first sacrificial layer according to the present invention. The sacrificial layer 360 is a typical example of the second sacrificial layer according to the present invention.

Figure 8A:
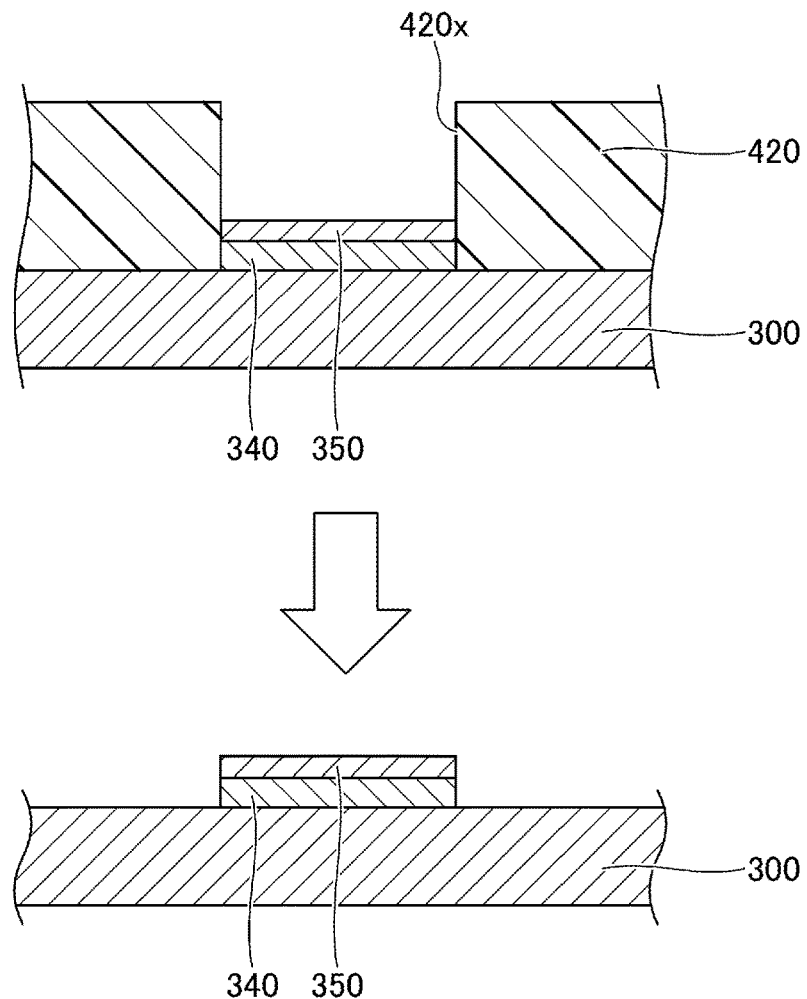
FIG. 8A and FIG. 8B are diagrams (part 1) illustrating an example of the processes of manufacturing the wiring board according to the second embodiment.

More particularly, first, in the process illustrated in FIG. 8A, a resist layer 420 (for example, a dry film resist or the like) having an opening 420x is formed in a predetermined region on the upper surface of the support body 300. Then, the sacrificial layers 340 and 350 are successively laminated on the upper surface of the support body 300 exposed inside the opening 420x in the resist layer 420, by electrolytic plating or the like utilizing the support body 300 as a plating power supply layer. Thereafter, the resist layer 420 is removed. As an example, the sacrificial layer 340 is a copper layer, and the sacrificial layer 350 is a nickel layer. The sacrificial layers 340 and 350 are metal layers that are ultimately removed by etching. A thickness of the sacrificial layer 340 may be in a range of approximately 5 µm to approximately 20 µm, for example. A thickness of the sacrificial layer 350 may be in a range of approximately 1 µm to approximately 10 µm, for example. It is not essential to provide the sacrificial layer 340, which is a copper layer, on the support body 300. However, by providing the sacrificial layer 340, which is the copper layer, on the support body 300, it is possible to obtain an effect of canceling unevenness of (or irregularities on) the upper surface of the support body 300, and to obtain an effect of improving adhesion to the support body 300.

Figure 8B:
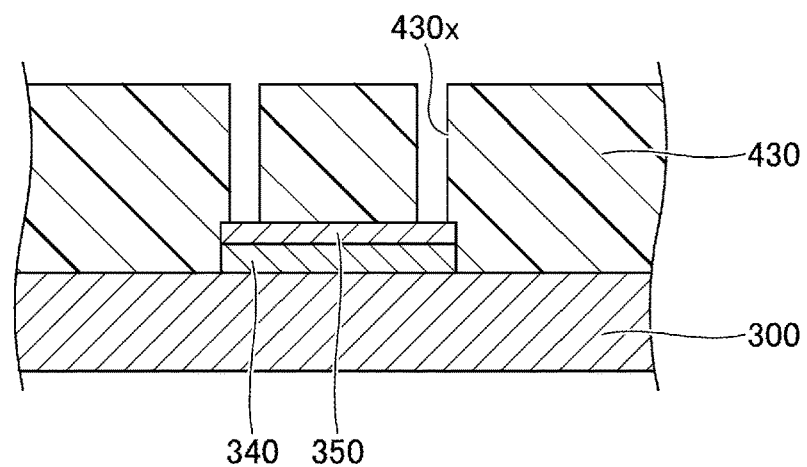

Next, in the process illustrated in FIG. 8B, a resist layer 430 (for example, a dry film resist or the like), including an opening 430x that opens an outer periphery of an upper surface of the sacrificial layer 350 in a ring shape, is formed on the upper surface of the support body 300. In order to prevent a misalignment (or positional error) with the upper surface of the sacrificial layer 350, the opening 430x is preferably not provided in an outermost peripheral portion of the upper surface of the sacrificial layer 350. In other words, the outermost peripheral portion of the upper surface of the sacrificial layer 350 is preferably covered with the resist layer 430.

Figure 9A:
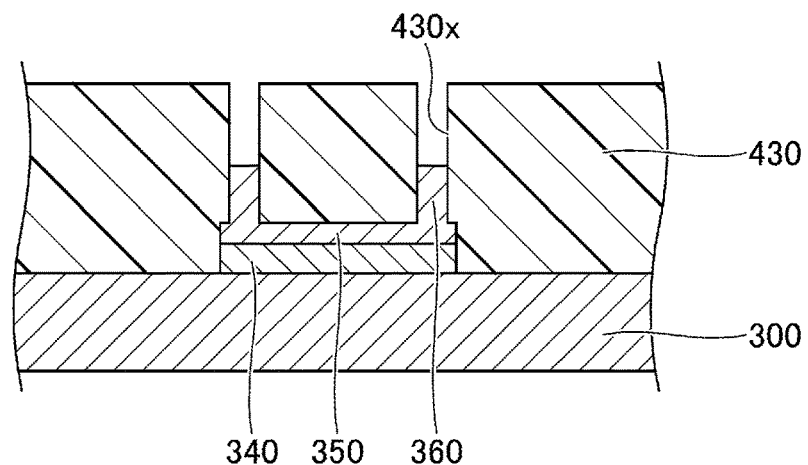
FIG. 9A, FIG. 9B, and FIG. 9C are diagrams (part 2) illustrating the example of the processes of manufacturing the wiring board according to the second embodiment.
Figure 9B:
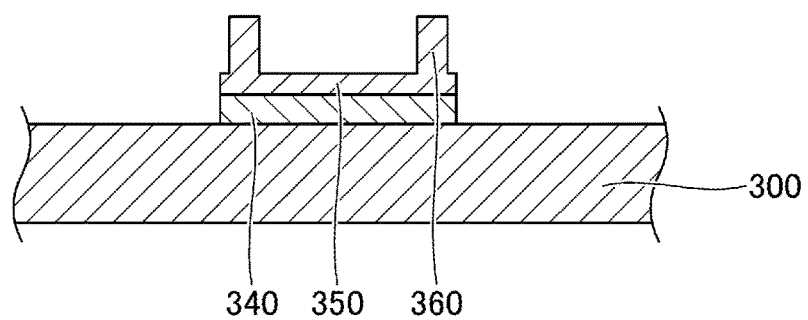

Next, in the process illustrated in FIG. 9A, an annular (or ring shaped) sacrificial layer 360, protruding from the upper surface of the sacrificial layer 350, is formed on the support body 300. More particularly, the sacrificial layer 360 is formed on the upper surface of the sacrificial layer 350 exposed inside the opening 430x in the resist layer 430, by electrolytic plating or the like utilizing the support body 300, the sacrificial layer 350, and the sacrificial layer 350 as a plating power supply layer. The sacrificial layer 360 is formed of a material that can be selectively etched with respect to the metal layer 11 in a subsequent process. As an example, the sacrificial layer 360 is a nickel layer. A width of the sacrificial layer 360 may be in a range of approximately 5 µm to approximately 30 µm, for example. A thickness of the sacrificial layer 360 may be in a range of approximately 10 µm to approximately 30 µm, for example. After forming the sacrificial layer 360, in the process illustrated in FIG. 9B, the resist layer 430 is removed. The sacrificial layer 340 and the sacrificial layer 350 are formed at positions overlapping each other in the plan view, and an outer edge of the sacrificial layer 360 is formed inside the outer edges of the sacrificial layers 340 and 350 in the plan view.

Figure 9C:
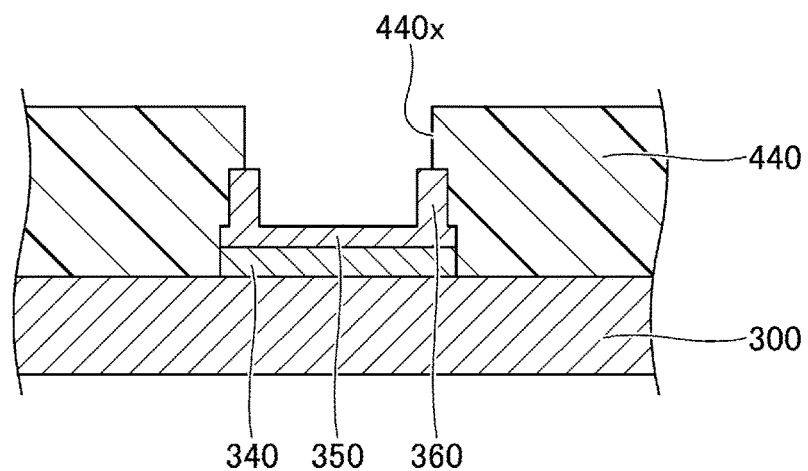
Figure 10A:
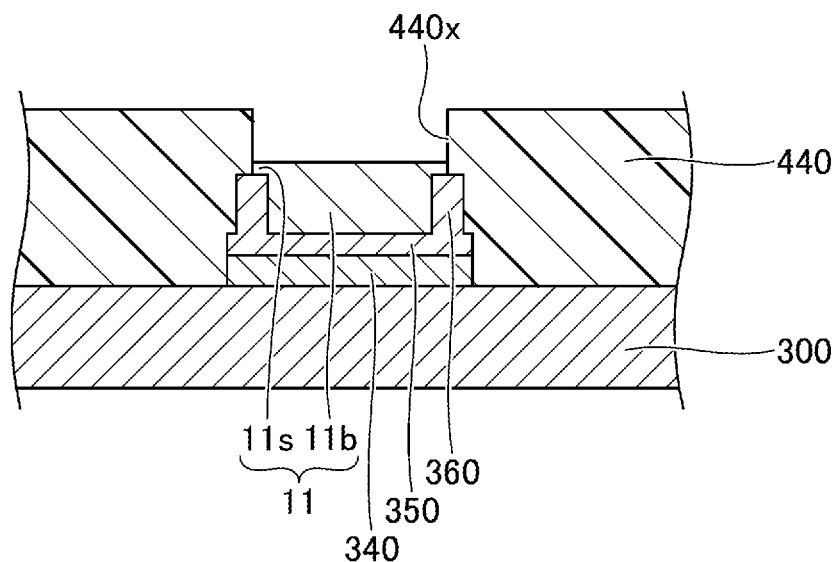
FIG. 10A and FIG. 10B are diagrams (part 3) illustrating the example of the processes of manufacturing the wiring board according to the second embodiment.

Next, in the processes illustrated in FIG. 9C and FIG. 10A, the metal layer 11 is formed so as to fill a recess formed by the sacrificial layer 350 and the sacrificial layer 360, cover an inner periphery of the upper surface of the sacrificial layer 360, and expose an outer periphery of the sacrificial layer 360. More particularly, first, in the process illustrated in FIG. 9C, a resist layer 440 (for example, a dry film resist or the like) is formed at a predetermined position on the upper surface of the support body 300, covering the outer periphery of the upper surface of the sacrificial layer 360 having the ring shape in the plan view, and including an opening 440x exposing the inner periphery of the sacrificial layer 360. The opening 440x is formed to a circular shape in the plan view, for example. In the plan view inside the opening 440x, the inner periphery of the upper surface of the sacrificial layer 360, and the upper surface of the sacrificial layer 350 surrounded by the sacrificial layer 360, are exposed.

Next, in the process illustrated in FIG. 10A, the metal layer 11 is formed on the upper surface of the sacrificial layer 350 exposed inside the opening 440x in the resist layer 440, and the upper surface and the inner side surface of the sacrificial layer 360, by electrolytic plating or the like utilizing the support body 300, the sacrificial layer 340, the sacrificial layer 350, and the sacrificial layer 360 as a plating power supply layer. The metal layer 11 includes the base portion 11b and the extending portion 11s. A portion of the metal layer 11 formed on the upper surface of the sacrificial layer 360 exposed inside the opening 440x forms the extending portion 11s, and other portions of the metal layer 11 form the base portion 11b. The metal layer 11 is formed of a material different from that of the sacrificial layers 350 and 360, so that the sacrificial layers 350 and 360 can be selectively etched in a subsequent process. In this example, because the sacrificial layers 350 and 360 are nickel layers, the metal layer 11 is a copper layer.

Figure 10B:
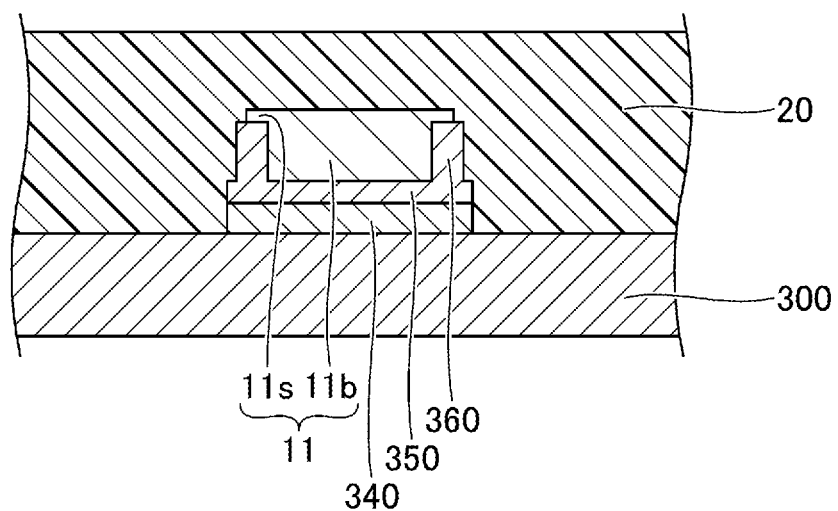

Next, in the process illustrated in FIG. 10B, the insulating layer 20 is formed on the support body 300, so as to cover the sacrificial layer 340, the sacrificial layer 350, the sacrificial layer 360, and the metal layer 11. More particularly, first, after removing the resist layer 440, a film of an epoxy-based resin or the like in a semi-cured state is laminated on the support body 300, and cured to form the insulating layer 20. The insulating layer 20 is formed so as to cover the upper surface and the outer side surface of the sacrificial layer 360 exposed from the metal layer 11, the upper surface and the side surface of the metal layer 11 exposed from the sacrificial layer 360, the outer periphery of the upper surface and the side surface of the sacrificial layer 350, and the side surface of the sacrificial layer 340. Alternatively, instead of laminating the film of the epoxy-based resin or the like in the semi-cured state, a liquid or paste of the epoxy-based resin or the like may be coated and thereafter cured, so as to form the insulating layer 20. The thickness or the like of the insulating layer 20 are as described above.

Figure 11A:
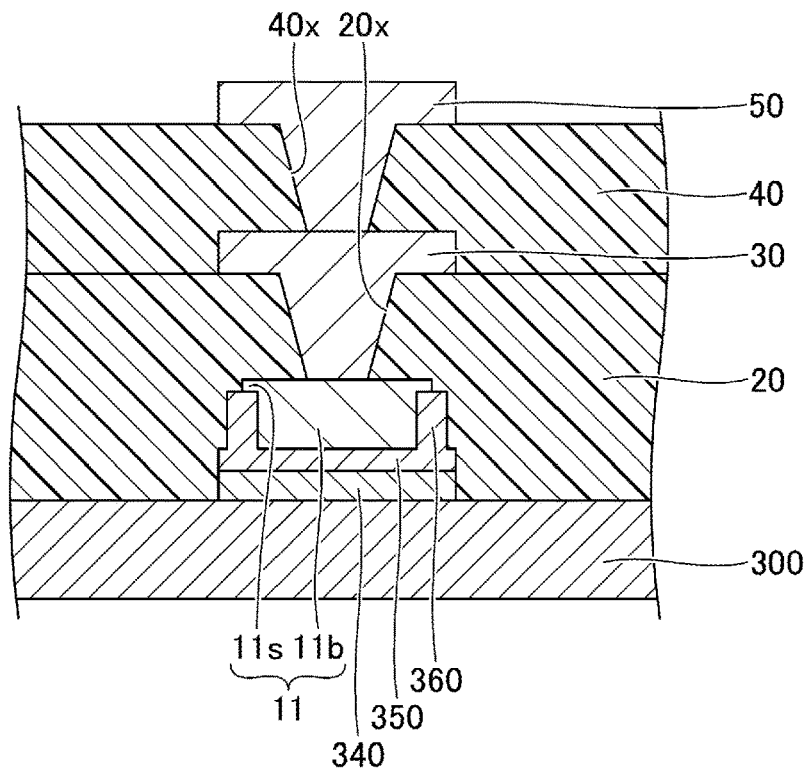
FIG. 11A and FIG. 11B are diagrams (part 4) illustrating the example of the processes of manufacturing the wiring board according to the second embodiment.

Next, in the process illustrated in FIG. 11A, the same processes as those described above in conjunction with FIG. 4A through FIG. 4C are performed to form the via hole 20x in the insulating layer 20 to expose the upper surface of the metal layer 11, and to further form the interconnect layer 30. Then, the insulating layer 40 is formed on the interconnect layer 30, the via hole 40x is formed in the insulating layer 40 to expose the upper surface of the via receiving pad of the interconnect layer 30, and the interconnect layer 50 is further formed.

Figure 11B:
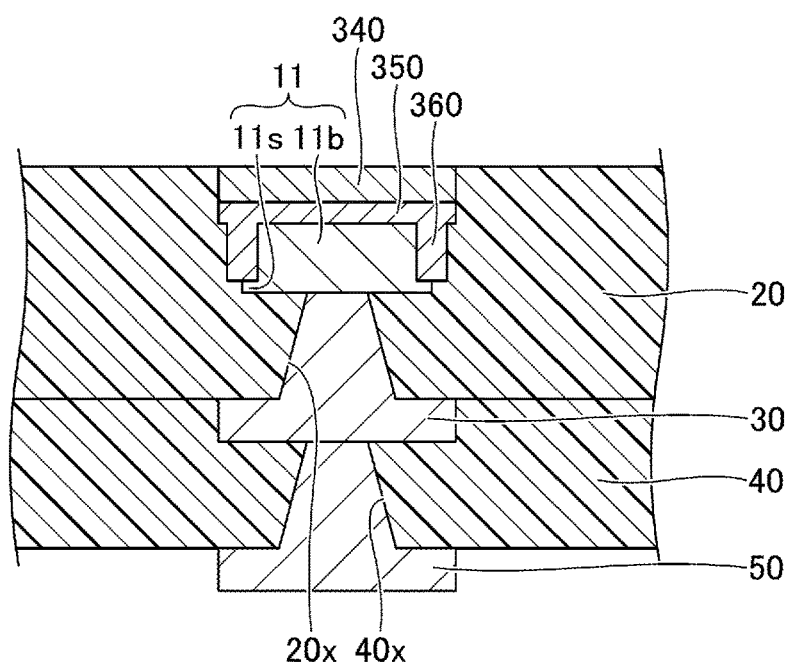

Next, in the processes illustrated in FIG. 11B through FIG. 12B, the support body 300, the sacrificial layer 340, the sacrificial layer 350, and the sacrificial layer 360 are removed by etching, and the external connection pad 10 including the metal layer 11 is formed. More particularly, first, in the process illustrated in FIG. 11B, the support body 300 illustrated in FIG. 11A is removed. The support body 300 can be removed by mechanical stripping, for example. In this case, the sacrificial layer 340 is not removed. The support body 300 made of the copper foil can be removed by wet etching using a hydrogen peroxide/sulfuric acid-based aqueous solution, a sodium persulfate aqueous solution, an ammonium persulfate aqueous solution, or the like, for example. In this case, the sacrificial layer 340, which is a copper layer, is also removed. FIG. 11B illustrates the structure in an up-side-down state with respect to the structure illustrated in FIG. 10B or the like. The same applies to FIG. 12A and FIG. 12B that will be described later.

Figure 12A:
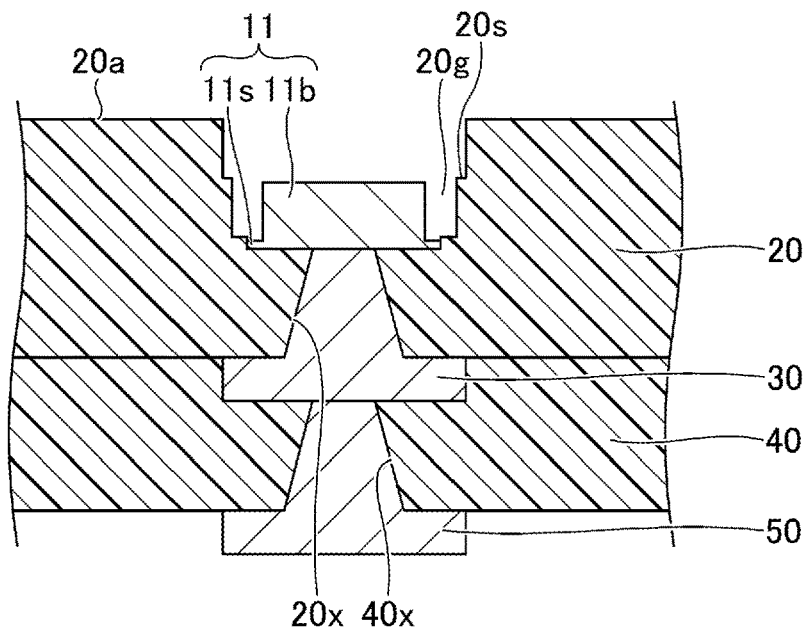
FIG. 12A and FIG. 12B are diagrams (part 5) illustrating the example of the processes of manufacturing the wiring board according to the second embodiment.

Next, in the process illustrated in FIG. 12A, the sacrificial layers 340, 350, and 360 illustrated in FIG. 11B are removed. The sacrificial layer 340, which is a copper layer, can be removed by wet etching using an etchant such as a hydrogen peroxide/sulfuric acid-based aqueous solution, a sodium persulfate aqueous solution, an ammonium persulfate aqueous solution, or the like, for example. The sacrificial layers 350 and 360, which are nickel layers, can be removed by wet etching using a hydrogen peroxide/nitric acid-based aqueous solution or the like, for example. In a case where the sacrificial layer 340 is removed in the process illustrated in FIG. 11B, the etching of the sacrificial layer 340 is not required. Because copper is not removed by the etchant for the nickel layer, the metal layer 11 will not be etched by this etchant. As a result, the groove 20g is formed is formed in the insulating layer 20, at the position in the periphery of the metal layer 11 in the plan view, and opening to the upper surface 20a of the insulating layer 20. For example, the groove 20g is formed in the ring shape in the plan view, so that the inner edge and the outer edge of the groove 20g form the circular shapes having the different diameters. In addition, the stepped surface 20s is formed on the side surface of the groove 20g of the insulating layer 20. Moreover, in the metal layer 11, the upper surface of the base portion 11b is exposed at a position that is recessed with respect to the upper surface 20a of the insulating layer 20, and the side surface of the base portion 11b, and the upper surface of the extending portion 11s, are exposed inside the groove 20g. In this state, the upper surface of the base portion 11b approximately coincides with the stepped surface 20s of the insulating layer 20. The upper surface of the extending portion 11s approximately coincides with the bottom surface of the groove 20g of the insulating layer 20.

Next, if necessary in order to remove the oxide film famed on the upper surface and the side surface of the base portion 11b and the upper surface of the extending portion 11s, the upper surface and the side surface of the base portion 11b and the upper surface of the extending portion 11s are etched by an amount in a range of approximately 2 μm to approximately 3 μm, for example. Thus, as illustrated in FIG. 12A, the upper surface of the base portion 11b becomes exposed at a position recessed by an amount in a range of approximately 2 μm to approximately 3 μm from the stepped surface 20s of the insulating layer 20. Further, the upper surface of the extending portion 11s becomes exposed at a position recessed by an amount in a range of approximately 2 μm to approximately 3 μm from the bottom surface of the groove 20g of the insulating layer 20.

Figure 12B:
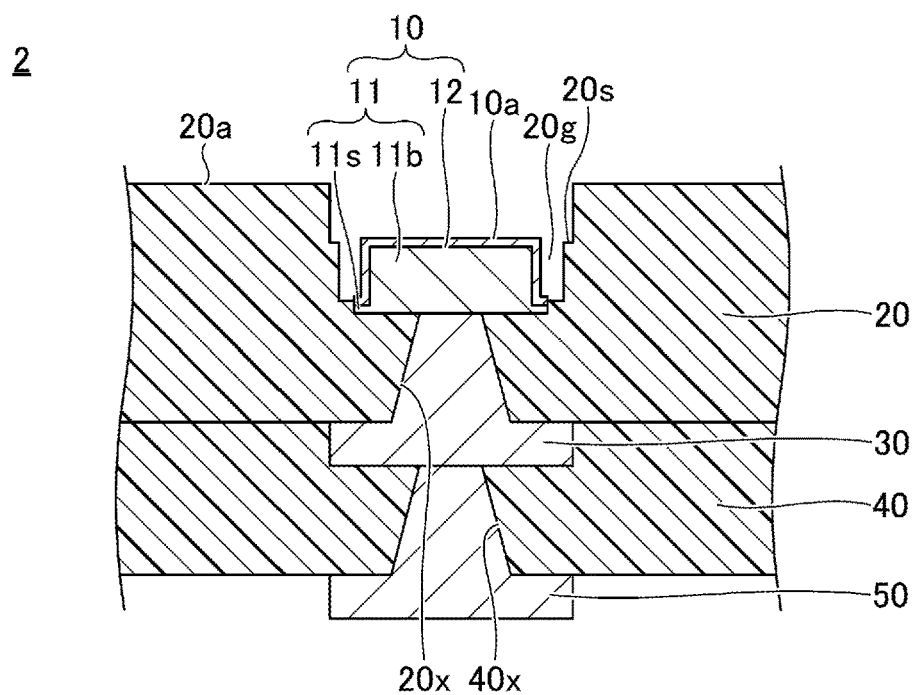

Next, in the process illustrated in FIG. 12B, the metal layer 12 is formed on the surface of the metal layer 11 exposed from the insulating layer 20, by electroless plating, for example. The metal layer 12 is as described above. As a result, the wiring board 2 is completed.

In this process, the metal layer 12 covering the side surface of the base portion 11b of the metal layer 11, and the metal layer 12 covering the upper surface of the extending portion 11s of the metal layer 11, are exposed from the insulating layer 20 inside the groove 20g. The upper surface of the metal layer 12 is located at a position higher than the stepped surface 20s by an amount in a range of approximately 2 μm to approximately 8 μm, for example. Further, the outer peripheral surface of the metal layer 12 is located at a position higher than the bottom surface of the groove 20g by an amount in a range of approximately 2 μm to approximately 8 μm, for example.

The wiring board 2 has the following advantageous features in addition to the advantageous features of the wiring board 1. That is, in the wiring board 2, because the upper surface 10a of the pad 10 is located at a position further lower than the upper surface 20a of the insulating layer 20, a center of gravity of the entire solder is located closer to a center of the wiring board 2, when compared to the wiring board 1. For this reason, it is possible to improve a stability of the connection between the pad 10 and the solder. In particular, it is possible to significantly improve the durability of the solder against a force applied in the horizontal direction (the direction parallel to the upper surface 10a) of the wiring board 2.

In addition, because the stepped surface 20s is formed on the side surface of the groove 20g of the insulating layer 20, corner portions contacted by the solder flowing into the groove 20g increases. Accordingly, because the force applied to the solder is dispersed, it is possible to improve the durability of the solder.

<First Modification of Second Embodiment>

A first modification of the second embodiment relates to an example of the wiring board having a pad with a different layer structure. In the first modification of the second embodiment, a description of the constituent elements that are the same as those of the embodiments described above may be omitted.

Figure 13A:
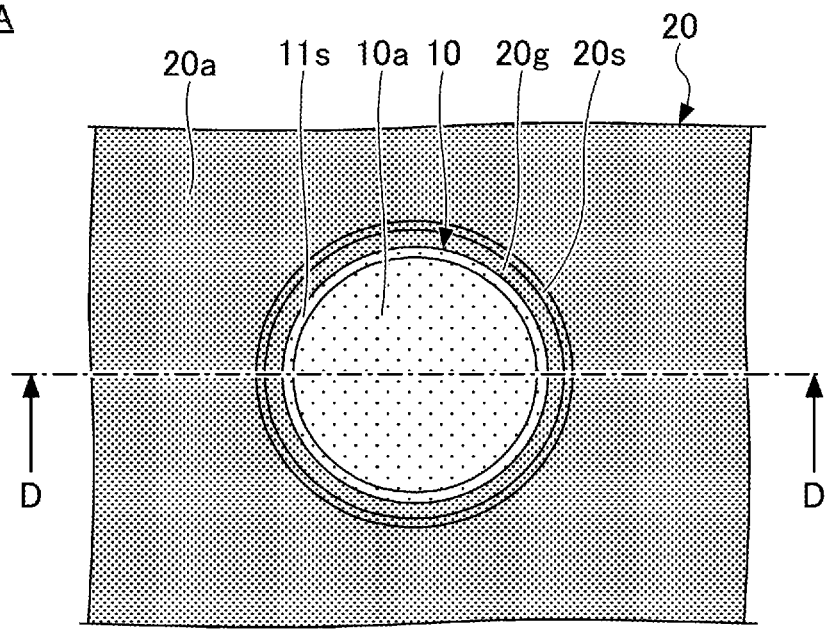
FIG. 13A and FIG. 13B are diagrams illustrating an example of the wiring board according to a first modification of the second embodiment.
Figure 13B:
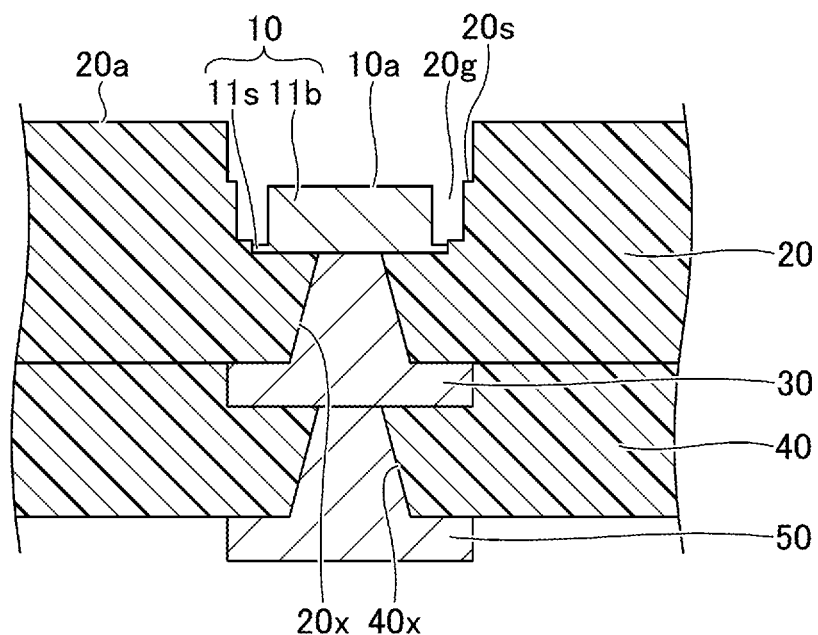

FIG. 13A and FIG. 13B are diagrams illustrating an example of the wiring board according to the first modification of the second embodiment. FIG. 13A is a partial plan view of the wiring board, and FIG. 13B is a partial cross sectional view of the wiring board along a line D-D in FIG. 13A.

As illustrated in FIG. 13A and FIG. 13B, the wiring board 2A differs from the wiring board 2 illustrated in FIG. 7A, FIG. 7B, or the like in that the pad 10 has a single-layer structure. The pad 10 is a copper layer, for example. The pad 10 includes the base portion 11b and the extending portion 11s, but does not include the metal layer 12.

The upper surface 10a of the pad 10 (the upper surface of the base portion 11b) is located at a position lower than the upper surface 20a of the insulating layer 20. The height of the upper surface 20a of the insulating layer 20, with reference to the upper surface of the base portion 11b of the pad 10, may be in a range of approximately 10 μm to approximately 70 μm, for example. Further, the upper surface 10a of the pad 10 (the upper surface of the base portion 11b) is located at a position lower than the stepped surface 20s. The height of the stepped surface 20s, with reference to the upper surface of the base portion 11b of the pad 10, may be in a range of approximately 2 μm to approximately 3 μm, for example. The upper surface of the extending portion 11s is located at a position lower than the bottom surface of the groove 20g. The height of the bottom surface of the groove 20g, with reference to the upper surface of the extending portion 11s, may be in a range of approximately 2 μm to approximately 3 μm, for example.

An organic film that covers the upper surface and the side surface of the base portion 11b of the pad 10, and the upper surface of the extending portion 11s of the pad 10, may be provided, as required. The organic film includes an azole compound, an imidazole compound, or the like, for example. A thickness of the organic film may be approximately 1 μm or less, for example. Although the illustration of the organic film is omitted in FIG. 13B to simplify the drawing, a coverage provided by the organic film will be the same as the coverage provided by the metal layer 12 in FIG. 12B, for example.

The wiring board 2A illustrated in FIG. 13A and FIG. 13B can be manufactured by processes that are the same as those of the second embodiment described above in conjunction with FIG. 8A through FIG. 12A. After the process illustrated in FIG. 12A, the organic film can be formed by performing an OSP process with respect to the base portion 11b and the extending portion 11s, as required.

In a case where the pad 10 has the single-layer structure and the organic film is not famed, the etching process for removing the oxide film is not required.

Accordingly to each of the embodiments and modifications described above, it is possible to provide a wiring board in which an outer edge of an external connection pad is disposed on the inner side of an outer edge of an opening in an insulating layer, and a method for manufacturing such a wiring board.

Various aspects of the subject-matter described herein may be set out non-exhaustively in the following numbered clauses:

1. A method for manufacturing a wiring board, comprising:
   forming a first sacrificial layer on a support body, and further forming an annular second sacrificial layer protruding from an upper surface of the first sacrificial layer;
   forming a metal layer filling a recess formed by the first sacrificial layer and the second sacrificial layer, covering an inner periphery of an upper surface of the second sacrificial layer, and exposing an outer periphery of the upper surface of the second sacrificial layer;
   forming an insulating layer on the support body, so as to cover the first sacrificial layer, the second sacrificial layer, and the metal layer; and
   removing the support body, the first sacrificial layer, and the second sacrificial layer by etching, to form an external connection pad including the metal layer,
   wherein the first sacrificial layer and the second sacrificial layer are formed of a material that can be selectively etched with respect to the metal layer.

2. The method for manufacturing the wiring board according to clause 1, wherein
   the first sacrificial layer is formed in a predetermined region on the support body, and
   an outer edge of the second sacrificial layer is formed on an inner side of an outer edge of the first sacrificial layer in a plan view.

Although the embodiments are numbered with, for example, "first," or "second," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
   a pad configured to make an external electrical connection; and
   an insulating layer, wherein
   the pad includes a base portion, and an extending portion formed integrally with the base portion and extending toward an outer periphery of a side surface of the base portion in a plan view at a lower end of the side surface of the base portion,
   the insulating layer is provided with a groove that is located in a periphery of the pad in the plan view,
   the groove extends along and exposes the side surface of the base portion, and opens to an upper surface of the insulating layer,
   the extending portion is disposed at a bottom of the groove, and at least a portion of a lower surface of the extending portion, opposite from the base portion, is in contact with the insulating layer, and
   a side surface of the groove is located on an outer side of a side surface of the extending portion in the plan view.

2. The wiring board as claimed in claim 1, wherein an upper surface of the base portion is located at a position lower than the upper surface of the insulating layer.

3. The wiring board as claimed in claim 2, wherein
   a stepped surface is formed on the side surface of the groove of the insulating layer, and
   the upper surface of the base portion is located at a position lower than the stepped surface.

4. The wiring board as claimed in claim 1, wherein an upper surface of the extending portion is located at a position lower than a bottom surface of the groove.

5. The wiring board as claimed in claim 1, further comprising:

a metal layer covering an upper surface and the side surface of the base portion, and an upper surface of the extending portion.

6. The wiring board as claimed in claim 5, wherein an upper surface of the metal layer is located at a position higher than the upper surface of the insulating layer.

7. The wiring board as claimed in claim 5, wherein an upper surface of a portion of the metal layer laminated on the extending portion is located at a position higher than a bottom surface of the groove.

8. The wiring board as claimed in claim 1, further comprising:
   an organic film covering an upper surface and the side surface of the base portion, and an upper surface of the extending portion.

9. The wiring board as claimed in claim 2, wherein an upper surface of the extending portion is located at a position lower than a bottom surface of the groove.

10. The wiring board as claimed in claim 9, further comprising:
    a metal layer covering the upper surface and the side surface of the base portion, and the upper surface of the extending portion.

11. The wiring board as claimed in claim 1, further comprising:
    an interconnect layer formed on a lower surface of the insulating layer,
    wherein the interconnect layer includes a via interconnect penetrating the insulating layer and making contact with the lower surface of the extending portion.

* * * * *